United States Patent [19]

Sheu

[11] Patent Number: 4,840,917
[45] Date of Patent: * Jun. 20, 1989

[54] METHOD OF INTERFACE STATE REDUCTION IN MNOS CAPACITORS

[75] Inventor: Yea-Dean Sheu, Rochester, N.Y.

[73] Assignee: Eastman Kodak Company, Rochester, N.Y.

[*] Notice: The portion of the term of this patent subsequent to Jun. 20, 2006 has been disclaimed.

[21] Appl. No.: 218,004

[22] Filed: Jul. 13, 1988

[51] Int. Cl.[4] ............... H01L 21/00; H01L 21/02; H01L 21/477; H01L 29/00
[52] U.S. Cl. .................................. 437/10; 437/12; 437/13; 437/247
[58] Field of Search ............. 437/10, 12, 13, 941

[56] References Cited

U.S. PATENT DOCUMENTS 3,923,559  12/1975  Sinha ............................ 437/941

FOREIGN PATENT DOCUMENTS 2056174   8/1980  United Kingdom ............. 437/941
2140202  11/1984  United Kingdom ............. 437/941

*Primary Examiner*—Brian E. Hearn
*Assistant Examiner*—B. Everhart
*Attorney, Agent, or Firm*—Raymond L. Owens

[57] ABSTRACT

A method to reduce the interface state density in MNOS (Conductor-Nitride-Oxide-Semiconductor) is disclosed. This method involves sintering an unpatterned Al film on top of an CVD oxide layer over MNOS capacitors to generate atomic hydrogen which diffuse through the nitride and oxide and passivate the interface states at Si/SiO$_2$ interface.

4 Claims, 2 Drawing Sheets

METHOD OF INTERFACE STATE REDUCTION IN MNOS CAPACITORS

CROSS-REFERENCE TO RELATED APPLICATION

Reference is made to commonly assigned U.S. patent application Ser. No. 191,526 filed May 9, 1988 entitled "Method of Noise Reduction in CCD Solid State Imagers" to Sheu and Hawkins.

FIELD OF THE INVENTION

This invention relates to MNOS (Conductor-Nitride-Oxide-Semiconductor) capacitors, and more particularly to a method to reduce the interface state density in such capacitors.

BACKGROUND OF THE INVENTION

MNOS capacitors are often advantageously used. M represents a conductor such as metal but more frequently is polysilicon. N is a nitride layer. O is an oxide layer preferably $SiO_2$ and S is the silicon substrate. A problem with MNOS capacitors is that the interface states density in MNOS capacitors is higher than that in MOS (Metal-Oxide-Semiconductor) capacitors due to the fact tha nitride is a diffusion barrier to molecular hydrogen which passivate the interface states. Alternative ways to introduce hydrogen into the active area in the MNOS devices is performed by removing the nitride in the field oxide in the vicinity of device active area followed by annealing in hydrogen at 1000° C. to laterally drive the hydrogen to the active $Si/SiO_2$ interface, or, by implanting hydrogen into the field oxide area followed by annealing at 450° C. also to laterally drive the hydrogen to the device active area.

SUMMARY OF THE INVENTION

The present invention provides a new method to introduce atomic hydrogen into the MNOS capacitors to reduce the $Si/SiO_2$ interface state density. This method involves deposition of a CVD oxide layer on top of the MNOS capacitors followed by the deposition of an Al layer. After annealing the wafer, the Al and CVD oxide are etched off by standard wet etch. Al react with trace water at the Al/oxide interface and release atomic hydrogen. One importance difference between molecular and atomic hydrogen is that atomic hydrogen can diffuse through the nitride layer at 450° C. while the other cannot. As a result, interface state density in MNOS capacitors can be reduced significantly after this treatment while no effect is observed after conventional sintering in a hydrogen containing ambient.

MODE OF CARRYING OUT INVENTION

Figure 1:
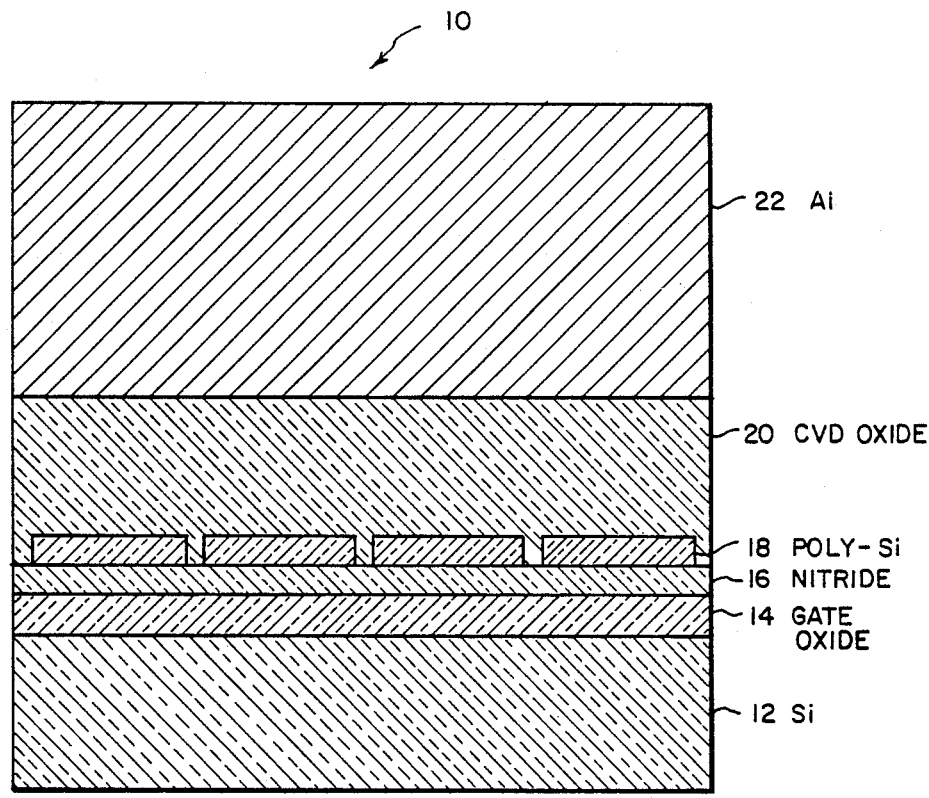
FIG. 1 shows an MNOS capacitor during the sintering step of this invention.

Referring to FIG. 1 a MNOS capacitor 10 is shown just prior to a sintering step. It has six layers. Layer 12 is a silicon substrate. A gate oxide layer 14 $SiO_2$ is thermally grown from layer 12; layer 16 is CVD nitride which can be formed by the reaction of $SiH_2Cl_2$ with $NH_3$ at 800° C.; layer 18 is a patterned polysilicon gate electrode. The term M in MNOS stands for metal, but any other conductor can be used. In fact, polysilicon is preferred.

In accordance with the method of this invention, a Chemical Vapor Deposition (CVD) oxide layer or layer 20, preferably having a thickness of about 5000 Å is deposited on top of a series of MNOS capacitors. An Al film or layer 22 is then deposited on top of the CVD oxide layer. The Al layer is preferably 5000 Å to 1 $\mu$m thick. The CVD oxide film is exposed to atmospheric moisture during the transferring from the oxide deposition equipment to the Al deposition equipment. Trace water may be incorporated in the CVD oxide during this time. The capacitors 10 are sintered at 450° C. for 30 minutes. The sintering ambient can be $N_2$ or 10% $H_2$ in $N_2$. The Al and CVD oxide are then completely etched off by standard wet etch. The result of the above process is that the gate oxide/silicon interface is passivated by atomic hydrogen.

Figure 2:
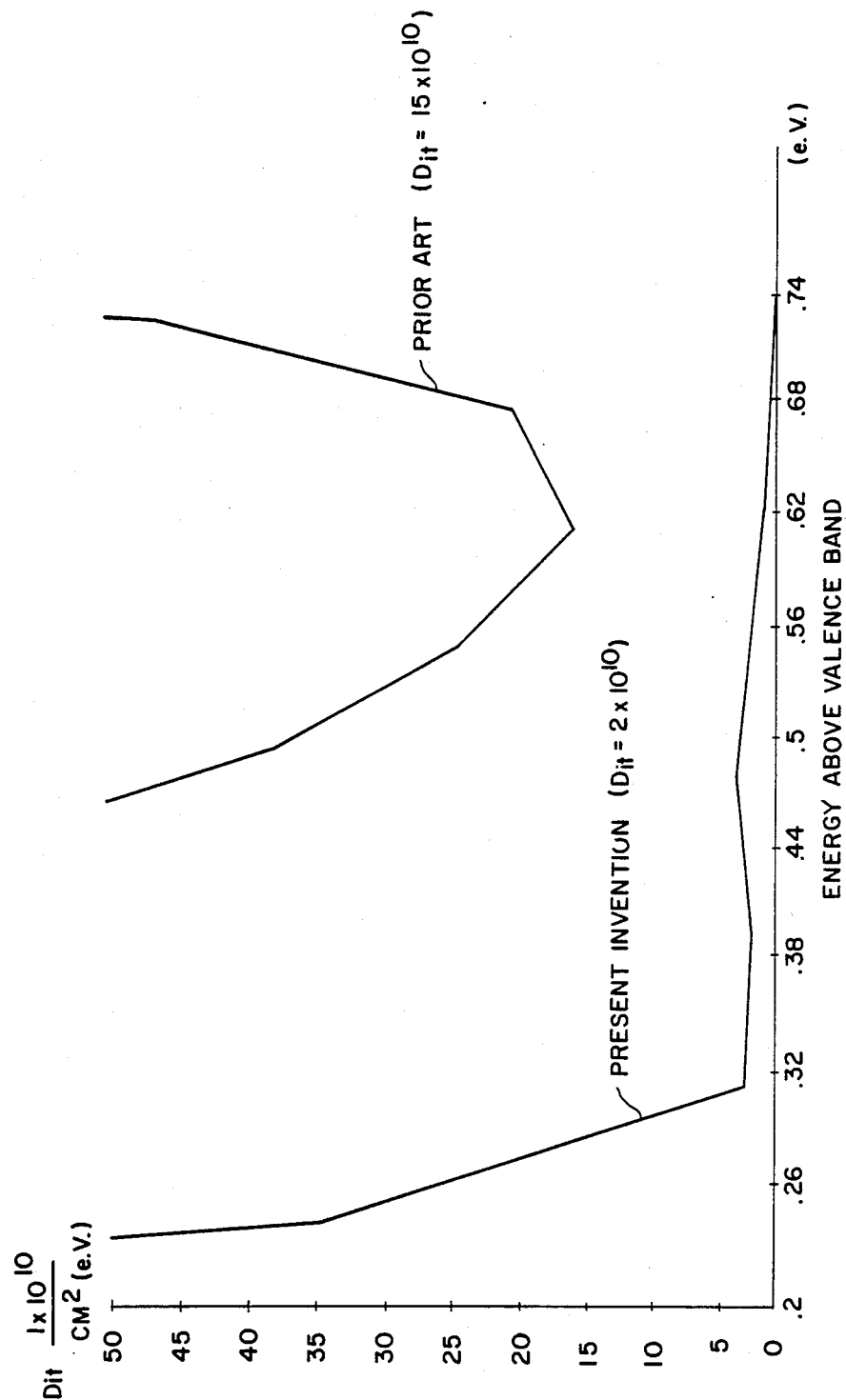
FIG. 2 is a graph that compares the interface states density with and without using the method of this invention.

As shown in FIG. 2 actual data was obtained using low-frequency capacitance versus voltage measurements. The resultant minimum interface state density $D_{it}$ on $Si/SiO_2$ interface was measured from a capacitor using the prior art process discussed above was about:

$$15 \times 10^{10}/(cm^2.e.V)$$

At the same position at the X- axis $D_{it}$ using the present invention was about:

$$2 \times 10^{10}/(cm^2.e.V)$$

These data show that in accordance with this invention the reduction of interface density is substantial. The interface state density reduction is due to the production of atomic hydrogen released from the Al/oxide interface during reaction between A'and trace water in the oxide. The atomic hydrogen diffuses through the polysilicon gates electrodes 18 and nitride layer 16 to the $Si/SiO_2$ interface to annihilate interface states.

Advantage

In order to passivate interface state, the invention not only require minor changes in a conventional process. The invention involves a low temperature process which is required in VLSI processes. The invention is also free from the radiation damage which is inherent in the method using hydrogen implantation.

The invention has been described in detail with particular reference to a preferred embodiment thereof, but it will be understood that variations and modifications can be effected within the spirit and scope of the invention.

I claim:

1. A method of reducing the interface state density between Si and $SiO_2$ in an MNOS (conductor-nitride-oxide silicon) structure, comprising the steps of:
   (a) forming an oxide layer over the metal;
   (b) forming an unpatterned Al layer over the oxide layer having trace water;
   (c) sintering the unpatterned Al layer to generate sufficient hydrogen atoms from trace water in the oxide layer to reduce the interface state between Si and $SiO_2$.

2. A method of reducing the interface state density between Si and $SiO_2$ in a plurality of MNOS (conductor electrode—nitride—$SiO_2$—Si) capacitors wherein the conductor electrodes are spaced apart, comprising the steps of:

(a) forming an oxide over the exposed nitride layers and conductor electrodes;
(b) forming an Al layer over the oxide layer so that the Al layer is in contact with trace water on the underlying oxide layer; and
(c) sintering the Al film at a temperature selected so that sufficient numbers of hydrogen atoms from the trace water are formed and they diffuse through the oxide layer to the interface between the Si and SiO$_2$ layers.

3. The method of claim 2 wherein the sintering temperature is 450° C.

4. The method of claim 2 further including removing the Al and oxide layers.

* * * * *